(12) United States Patent
Kim et al.

(10) Patent No.: US 8,772,145 B2
(45) Date of Patent: Jul. 8, 2014

(54) CARBON NANOTUBE DISPERSION LIQUID AND METHOD OF MANUFACTURING THIN LAYER AND DISPLAY PANEL USING THE SAME

(75) Inventors: Jaehyun Kim, Paju-si (KR); Seongkee Park, Goyang-si (KR); Jungshik Lim, Seoul (KR); Taeyoung Lee, Paju-si (KR); Mincheol Kim, Incheon-si (KR)

(73) Assignee: LG Display Co., Ltd., Seoul (KR)

( * ) Notice: Subject to any disclaimer, the term of this patent is extended or adjusted under 35 U.S.C. 154(b) by 620 days.

(21) Appl. No.: 12/956,795

(22) Filed: Nov. 30, 2010

(65) Prior Publication Data

US 2011/0165711 A1 Jul. 7, 2011

(30) Foreign Application Priority Data

Dec. 1, 2009 (KR) .................. 10-2009-0117722

(51) Int. Cl.
| | | |
|---|---|---|
| H01L 51/05 | (2006.01) | |
| B82Y 30/00 | (2011.01) | |
| B82Y 10/00 | (2011.01) | |
| C01B 31/02 | (2006.01) | |
| B82Y 40/00 | (2011.01) | |
| H01L 51/00 | (2006.01) | |

(52) U.S. Cl.
CPC ............. C01B 31/0273 (2013.01); B82Y 30/00 (2013.01); B82Y 10/00 (2013.01); H01L 51/0048 (2013.01); H01L 51/0003 (2013.01); B82Y 40/00 (2013.01)
USPC ............................................ 438/584; 438/99

(58) Field of Classification Search
USPC .................... 438/584, 585, 99; 257/E21.001, 257/E21.211; 977/932, 936, 952
See application file for complete search history.

(56) References Cited

U.S. PATENT DOCUMENTS

| | | | |
|---|---|---|---|
| 2008/0283875 A1* | 11/2008 | Mukasa et al. | 257/253 |
| 2009/0045397 A1* | 2/2009 | Iwasaki | 257/43 |
| 2009/0233001 A1* | 9/2009 | Smits et al. | 427/458 |

FOREIGN PATENT DOCUMENTS

| | | | |
|---|---|---|---|
| CN | 1872673 A | | 12/2006 |
| CN | 1994876 A | * | 7/2007 |
| JP | 2005029696 A | * | 2/2005 |
| KR | 100869161 B1 | | 11/2008 |

OTHER PUBLICATIONS

Scheibe et al., "Enhancement of thermal stability of multiwalled carbon nanotubes via different silanization routes", Journal of Alloys and Compounds, 2010: pp. 117-124.*
Friddle et al., "Single functional group interactions with individual carbon nanotubes", Nature Publishing Group, 2007: pp. 696-697.*
"Aminoalkanethiol", DoJindo Molecular Technologies, 2012, http://www.dojindo.com/store/c/121-Aminoalkanethiol.aspx.*
Chemical BooK webiste, Properties of DMF, http://www.chemicalbook.com/ChemicalProductProperty_EN_CB2854115.htm (2010).*
Cordeiro et al., "Study of Water and Dimethylformamide Interaction by Computer Simulation", Z. Naturforsch (1999): pp. 110-116.*

(Continued)

Primary Examiner — Michele Fan
(74) Attorney, Agent, or Firm — Brinks Gilson & Lione

(57) ABSTRACT

The present invention relates to a carbon nanotube dispersion liquid includes carbon nanotubes, a self assembly material having —$NR_2$ in one terminal thereof and —$Si(OR)_3$ or —SH in the other terminal thereof, and a solvent, as well as its usage.

8 Claims, 9 Drawing Sheets

(56) References Cited

OTHER PUBLICATIONS

Volume of Solvent Plus Solute from Argone National Laboratoratory website, http://www.newton.dep.anl.gov/askasci/chem03/chem03838.htm (2006).*

The Law of Conservation of Mass from the University of Wisconsin webiste, http://chem.wisc.edu/deptfiles/genchem/sstutorial/Text1/Tx14/tx14.html (2010).*

Office Action issued in corresponding Chinese Patent Application No. 201010570582.9, mailed Jul. 18, 2012.

Yitian et al., "Deposition of Multi-wall Carbon Nanotubes on Self-assembled Monolayer with Different Terminal Groups" China Mechanical Engineering, vol. 14, 2005.

Office Action issued in corresponding Korean Patent Application No. 10-2009-0117722, mailed Jun. 3, 2013, 4 pages.

* cited by examiner

CARBON NANOTUBE DISPERSION LIQUID AND METHOD OF MANUFACTURING THIN LAYER AND DISPLAY PANEL USING THE SAME

This application claims the benefit of Korea Patent Application No. 10-2009-0117722 filed on Dec. 1, 2009, which is incorporated herein by reference for all purposes as if fully set forth herein.

BACKGROUND

1. Field of the Disclosure

This disclosure relates to a carbon nanotube dispersion liquid and a method of manufacturing a thin layer and a display panel using the same.

2. Related Art

Since carbon nanotubes (CNTs) were discovered by S. Iijima of Maiji University with an electron microscope in 1991, a large number of studies on the carbon nanotubes have been carried out. The carbon nanotubes have graphene layers wrapped into perfect cylinders and have diameters of 1-20 nm. Graphite has unique arrangement and is in a strong flat hexagonal tubular layer structure. The top and bottom of the tubular layer are filled with free electrons and the electrons move in parallel with the tubular layer in a discrete state. A graphene layer is wrapped into a spiral to form a carbon nanotube, and thus edges are combined at different points. When the spiral or chirality of the carbon nanotube is changed, the motions of the free electrons are varied.

When the motions of the free electrons become perfectly free, the carbon nanotube reacts like metals or overcome the band gap thereof like semiconductors. The band gap is determined by the diameter of the nanotube. When the diameter of the nanotube is minimum value, the energy level may be decreased to 1 eV. The carbon nanotube has excellent mechanical strength and chemical stability and includes metallic nature and semiconductor nature. Furthermore, the carbon nanotube has a small diameter and a long length and is hollow. Accordingly, the carbon nanotube has excellent properties as a material of display devices, transistors and energy storages and has high applicability as nano-sized electronic devices.

To form the carbon nanotubes on a substrate, a carbon nanotube dispersion liquid mixed with a solvent is coated on the substrate. However, the carbon nanotube dispersion liquid has low adhesion to the substrate, and thus the carbon nanotube dispersion liquid is coated on the substrate to form a thin film and then an adhesion polymer is coated on the thin film.

Such carbon nanotube forming method includes an additional adhesion polymer coating process, and thus productivity is decreased due to equipment investments and a long tack time and contact resistance between carbon nanotubes increases due to the adhesion polymer.

SUMMARY

In an aspect, a carbon nanotube dispersion liquid comprising carbon nanotubes, a self assembly material having —$NR_2$ at one terminal thereof and —$Si(OR)_3$ or —SH at the other terminal thereof, and a solvent. Here, R is H or $C_nH_{(2n+1)}$, wherein n is natural number. Also, —$NR_2$, —$Si(OR)_3$ and —SH are functional group respectively.

In another aspect, a method of manufacturing a carbon nanotube thin film comprising providing a substrate and coating a carbon nanotube dispersion liquid including carbon nanotubes, a self assembly material having —$NR_2$ at one terminal thereof and —$Si(OR)_3$ or —SH at the other terminal thereof, and a solvent on the substrate to form a thin film.

The substrate may be one selected from a group consisting of Si, $SiN_x$, $SiO_2$ and a dielectric layer.

In another aspect, a method of manufacturing a display device comprising providing a substrate, forming a gate electrode on the substrate, forming a gate insulating layer on the substrate including the gate electrode, and coating a carbon nanotube dispersion liquid including carbon nanotubes, a self assembly material having —$NR_2$ at one terminal thereof and —$Si(OR.)_3$ or —SH at the other terminal thereof, and a solvent on the gate insulating layer to form a thin film over the gate electrode.

The thin film may be a transparent conductive layer or a semiconductor layer.

BRIEF DESCRIPTION OF THE DRAWINGS

The implementation of this invention will be described in detail with reference to the following drawings in which like numerals refer to like elements.

DETAILED DESCRIPTION OF THE INVENTION

Hereinafter, an implementation of this invention will be described in detail with reference to the attached drawings.

A carbon nanotube dispersion liquid according to an embodiment of the present invention may include carbon nanotubes, a self-assembly material having —$NR_2$ at one terminal thereof and —$Si(OR)_3$ or —SH at the other terminal thereof, and a solvent. Here, R may be H or $C_nH_{(2n+1)}$, wherein n is natural number.

The carbon nanotubes are in a network structure and may have diameters of several nanometers and lengths of hundreds to thousands nanometers. The carbon nanotubes may be single-walled carbon nanotubes (SWNT), double-walled carbon nanotubes (DWNT) or multi-wall carbon nanotubes (MWNT). The carbon nanotubes can be used for various electric devices since they have high thermal conductivity, flexibility and transmissivity.

The self assembly material may be a self assembly monolayer (SAM) with carbon chain as the main bone, and may have —$NR_2$ at one terminal thereof for reinforcement bonding strength of the self assembly monolayer (SAM) with the carbon nanotubes, and may have —$Si(OR)_3$ or —SH at the other terminal thereof for reinforcement bonding strength of the self assembly monolayer (SAM) with a substrate. Here in one example, a material having —$NR_2$ at one terminal thereof and —$Si(OR)_3$ at the other terminal thereof may be an aminoalkyl silane group represented by Formula 1.

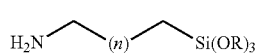

[Formula 1]

In another example, a material having —$NR_2$ at one terminal thereof and —SH at the other terminal thereof may be an aminoalkane thiol represented by Formula 2.

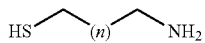

[Formula 2]

The solvent may include one or more selected from a group consisting of DI (Deionized) water, DMF (Dimethylformamide), DCE (Dichloroeghylene), alcohol based material, toluene based material, alkyne based material.

The carbon nanotube dispersion liquid may be formed by mixing carbon nanotubes, such as SWNT or MWNT and the present self assembly material into the solvent. Specifically, the carbon nanotube dispersion liquid may be manufactured through a step of adding the carbon nanotubes into the solvent and dispersing the carbon nanotubes in the solvent and a step of diluting the self assembly material with the carbon nanotube dispersed solvent. The carbon nanotube dispersion liquid may be manufactured under the reaction condition of about 25° C. and 1 ATM.

Here, in order to prevent carbon nanotubes from clumping together, the content of carbon nanotube in the carbon nanotube dispersion liquid may be below 10 wt %, preferably within about 0.1 wt %~about 1 wt %. Also, in order to prevent self assembly material from clumping together, the content of self assembly material in the carbon nanotube dispersion liquid may be below 1 vol %, preferably within about 0.1 vol %~about 1 vol %.

Figure 1:
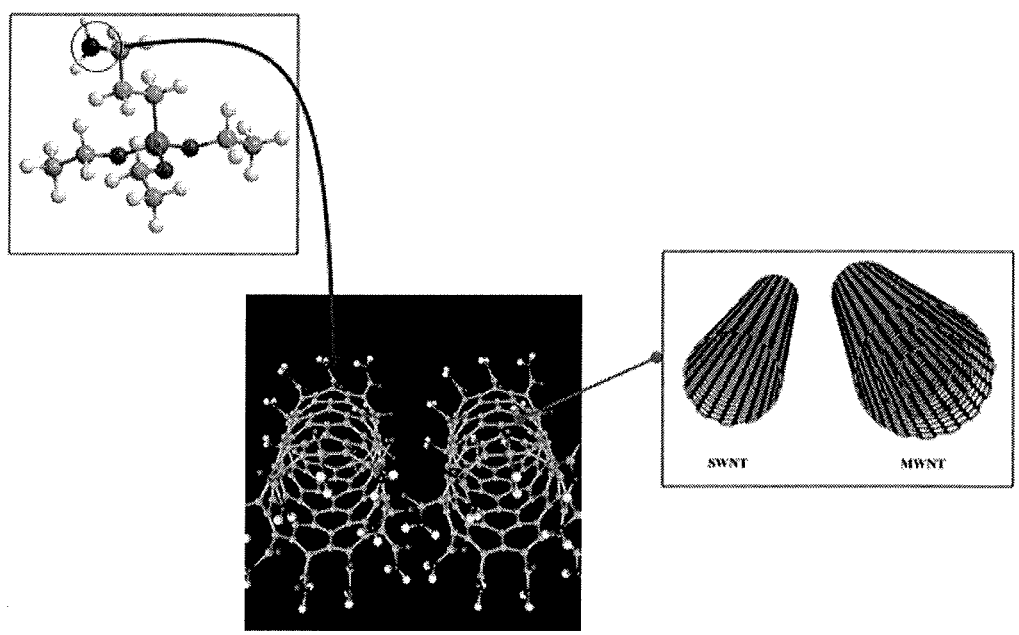
FIGS. 1, 2A and 2B illustrate combination of a self assembly material and carbon nanotubes of a carbon nanotube dispersion liquid.
Figure 2A:
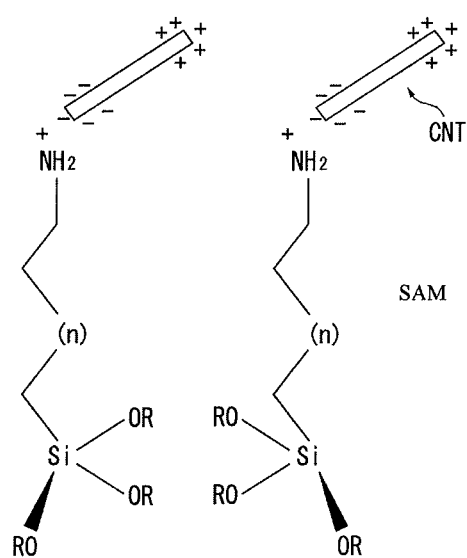
Figure 2B:
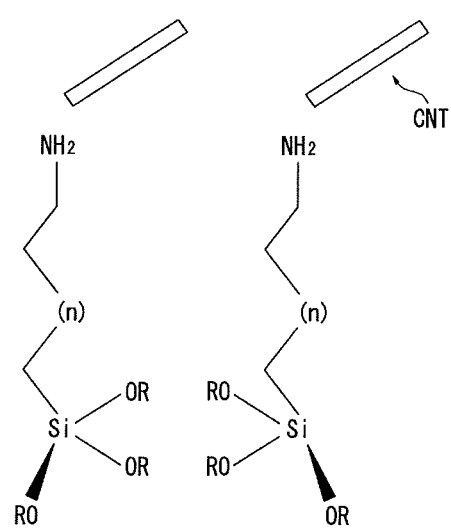

FIGS. 1, 2A and 2B illustrate exemplary combination of the carbon nanotubes and self assembly material in the carbon nanotube dispersion liquid.

Referring to FIGS. 1, 2A and 2B, the carbon nanotube dispersion liquid includes the self assembly material, and thus the dispersibility of the carbon nanotubes can be maintained.

More specifically, a one-dimensional nano material such as carbon nanotubes may have a dipole moment since partial charge separation occurs in the nano material due to an external environment, that is, static electricity and electric field. If the self assembly material is aminoalkyl silane, for example, the dipole moment is induced by a lone pair in N element of the self assembly material (polarization). Accordingly, the —$NH_2$ of the self assembly material, which has positive charges, and the carbon nanotubes are coordinately covalent bonded. As a result, aminoalkyl silane is combined with the carbon nanotubes in the carbon nanotube dispersion liquid, and thus the carbon nanotubes are terminated as —$Si(OR)_3$ and the outer part of the carbon nanotubes are surrounded by negative charges. Accordingly, a repulsive force is generated between carbon nanotubes so that the dispersibility can be maintained.

A method of manufacturing a thin film using the carbon nanotube dispersion liquid will now be explained.

Figure 3A:
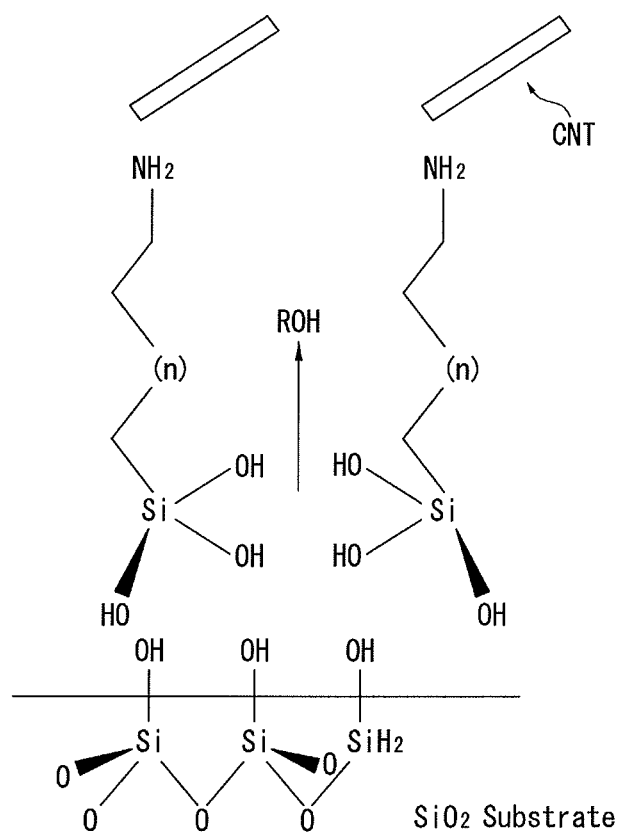
FIGS. 3A, 3B and 3C illustrate bonding of carbon nanotubes onto a substrate.
Figure 3B:
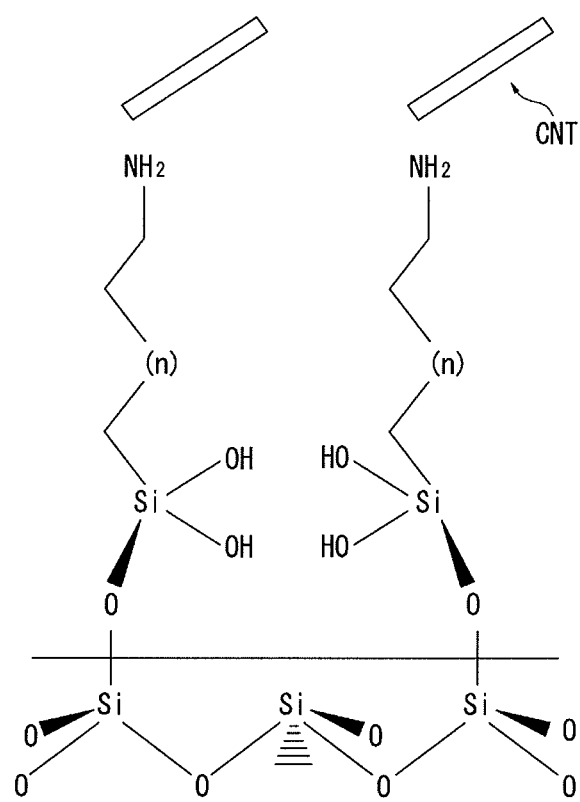
Figure 3C:
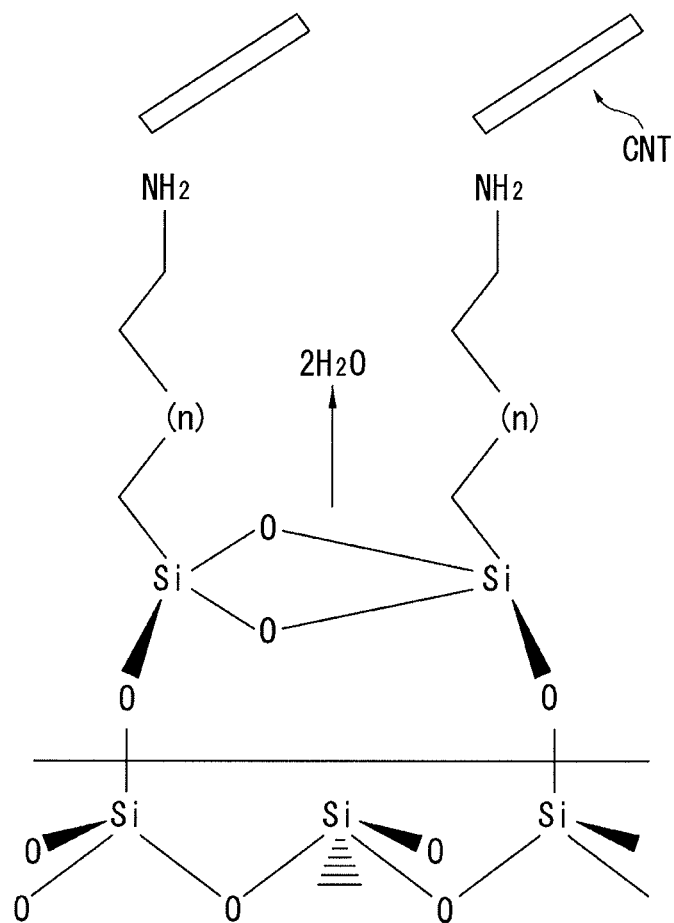
Figure 4:
FIG. 4 is a Scanning Electron Microscope (SEM) picture of a carbon nanotube thin film formed on a substrate according to an embodiment of the present invention.

FIGS. 3A, 3B and 3C illustrate bonding of carbon nanotubes onto a substrate and FIG. 4 is a SEM (Scanning Electron Microscope) picture of a carbon nanotube thin film formed on a substrate according to an embodiment of the present invention.

First, a substrate is provided. The substrate may be selected from a group consisting of Si, SiNx, $SiO_2$ and a dielectric layer.

The carbon nanotube dispersion liquid including the carbon nanotubes, the self assembly material having —$NR_2$ at one terminal thereof and —$Si(OR)_3$ or —SH at the other terminal thereof, and the solvent is coated on the substrate to form a thin film. That is, when the substrate is dipped in a container filled with the carbon nanotube dispersion liquid, the carbon nanotubes are ion-bonded onto the substrate.

—R from the —$Si(OR)_3$ of the self assembly material combined with the carbon nanotubes is released through hydrolysis to form ROH and the ROH decomposed from the carbon nanotube dispersion liquid coated on the substrate (FIG. 3A) and H is bonded to the site from which R escaped. The self assembly material combined with the carbon nanotubes is covalent-grafted to the substrate (FIG. 3B). That is, the —OH of Si of the substrate composed of $SiO_2$ is covalent grafted to the —OH of the self assembly material and $H_2O$ escaped. Finally, the carbon nanotubes are combined with each other through hydrolysis to form in-plane reticulation (FIG. 3C).

Accordingly, the carbon nanotubes are chemically bonded onto the substrate through the hydrolysis, covalent grafting and formation of in-plane reticulation, and thus the carbon nanotubes are integrated on the substrate to form a single layer, as shown in FIG. 4.

As described above, the method of manufacturing a thin film using the carbon nanotube dispersion liquid allows the carbon nanotube dispersion liquid including the carbon nanotubes and the self assembly material to be coated on the substrate to chemically bond the self assembly material combined with the carbon nanotubes to the substrate. Accordingly, the bonding strength of the substrate and the carbon nanotubes can be improved and the manufacturing process can be simplified by using a simple method of coating the carbon nanotube dispersion liquid to reduce the manufacturing cost.

Figure 5:
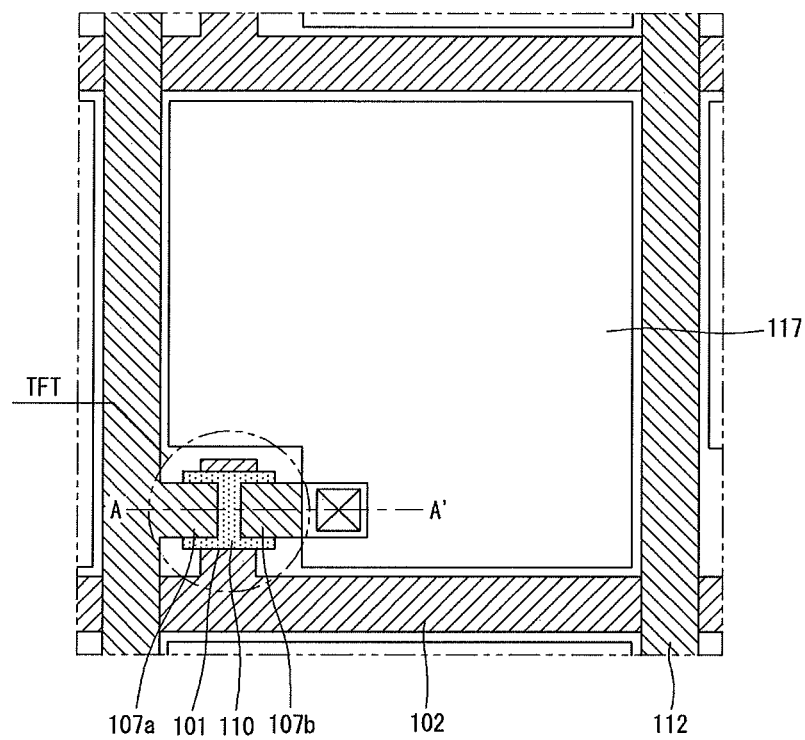
FIG. 5 illustrates a unit pixel of a display panel including a semiconductor layer of a thin film transistor, which is formed using a carbon nanotube dispersion liquid according to an embodiment of the present invention.

FIG. 5 illustrates a unit pixel of a display panel having a semiconductor layer of a thin film transistor, which is formed using the carbon nanotube dispersion liquid according to an embodiment of the present invention.

Referring to FIG. 5, the display panel may include gate lines 102 and data lines 112 formed on a substrate in an intersecting manner to define unit pixel regions, a thin film transistor TFT formed at the intersection of each gate line 102 and each data line 112, and a pixel electrode 117 formed in a portion of each unit pixel region other than the thin film transistor TFT. The thin film transistor TFT may include a gate electrode 101 extended from the corresponding gate line 102, a semiconductor layer 110 formed of carbon nanotubes and superposed on the gate electrode 101 having a gate insulating layer (not shown) formed between the gate electrode 101 and the semiconductor layer 110, a source electrode 107*a* extended from the corresponding data line 112 and formed on the gate electrode 101, and a drain electrode 107*b* formed on the gate electrode 101 opposite to the source electrode 107*a*. The drain electrode 107*b* may be electrically connected to the pixel electrode 117 through a contact hole formed in a passivation layer interposed between the drain electrode 107*b* and the pixel electrode 117.

FIGS. 6A, 6B, 6C and 6D are cross-sectional views showing a method of manufacturing the above-described display panel.

Figure 6A:
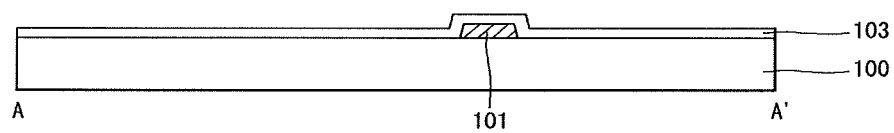
FIGS. 6A, 6B, 6C and 6D are cross-sectional views of FIG. 5 along the line of A-A' showing a method of manufacturing the display panel.

Referring to FIG. 6A, the gate electrode 101 and a gate line (not shown) are formed on a substrate 100. Specifically, a metal for forming the gate electrode 101 and the gate line is deposited on the substrate 100, and photoresist is coated on the metal layer and exposed using a mask. Then, the gate electrode 101 and the gate line are formed on the substrate 100 through developing and etching processes.

A gate insulating layer 103 is formed on the overall surface of the substrate 100 including the gate electrode 101. Here, the gate insulating layer 103 may be formed of $SiN_x$ or $SiO_2$ and formed in at least one layer.

Figure 6B:
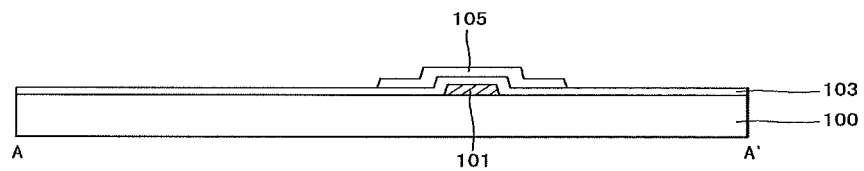

Referring to FIG. 6B, a carbon nanotube dispersion liquid is coated on the gate insulating layer 103 to form a thin film, that is, a semiconductor layer 105, over the gate electrode 101.

More specifically, carbon nanotubes are dispersed in a solvent and a self assembly material is diluted with the solvent in which the carbon nanotubes are dispersed to manufacture the carbon nanotube dispersion liquid. Here, the content of carbon nanotube in the carbon nanotube dispersion liquid may be below 10 wt %. The self assembly material may have —$NR_2$ at one terminal thereof and —$Si(OR)_3$ or —SH at the other terminal thereof and the content of self assembly material in the carbon nanotube dispersion liquid may be less than 1 vol %.

Figure 6C:
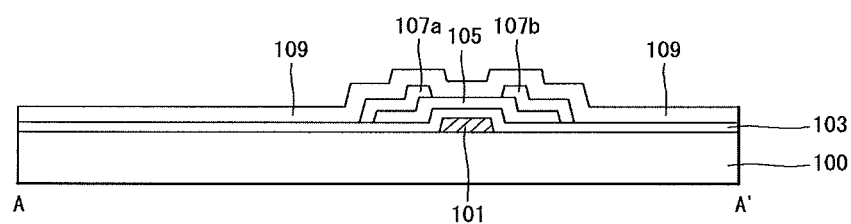

Referring to FIG. 6C, the source and drain electrodes 107a and 107b are formed on the substrate 100 on which the semiconductor layer 105 is formed of carbon nanotubes. Specifically, a metal such as Cr, Mo, Ti or the like is deposited on the overall surface of the substrate 100 including the semiconductor layer 105. Then, photoresist is coated on the metal layer and exposed using a mask, and then the source and drain electrodes 107a and 107b are formed through developing and etching processes.

Here, the distance between the source and drain electrodes 107a and 107b formed on the semiconductor layer 105 and partially superposed on the gate electrode 101 affects the thickness of the semiconductor layer 105. That is, the distance between the source and drain electrodes 107a and 107b is determined, and then the thickness of a single thin film constituting the semiconductor layer 105. When the thickness of the semiconductor layer 105 is determined first, the distance between the source and drain electrodes 107a and 107b is controlled.

A passivation layer 109 is formed on the overall surface of the substrate 100 including the source and drain electrodes 107a and 107b. The passivation layer 109 may be an inorganic insulating layer such as a SiNx layer or an organic insulating layer. The passivation layer 109 includes a contact hole that partially exposes the drain electrode 107b. The contact hole is formed through a photolithography process.

Figure 6D:
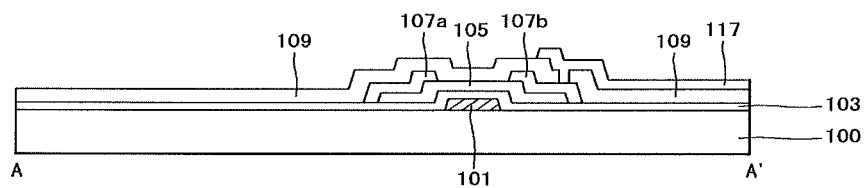

Referring to FIG. 6D, the pixel electrode 117 is formed on the substrate 100 including the passivation layer 109 through a photolithography process. Specifically, a transparent conductive material such as ITO (Indium Tin Oxide) or IZO (Indium Zinc Oxide) is deposited on the overall surface of the substrate 100 and photoresist is coated on the transparent conductive layer and exposed using a mask. Then, developing and etching processes are performed to form the pixel electrode 117.

The pixel electrode 117 in a unit pixel region defined by gate lines and data lines formed on the substrate 100 in an intersecting manner is electrically connected to the drain electrode 113 through the contact hole formed in the passivation layer 109.

The TFT array substrate formed through the above-described method is bonded to a color filter substrate having a liquid crystal layer interposed between the two substrates to accomplish the display panel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A carbon nanotube dispersion liquid comprising:
   carbon nanotubes;
   a self assembly material having —$NR_2$ at one terminal thereof and having —SH at the other terminal thereof, wherein, R is H or $C_nH_{(2n+1)}$, with n is natural number; and
   a solvent,
   wherein the self assembly material having —SH at the other terminal thereof comprises an aminoalkane thiol group,
   wherein the content of carbon nanotube in the carbon nanotube dispersion liquid is below about 10 wt %, and
   wherein the content of self assembly material in the carbon nanotube dispersion liquid is below 1 vol %.

2. The carbon nanotube dispersion liquid of claim 1, wherein the content of carbon nanotube in the carbon nanotube dispersion liquid is within about 0.1 wt %~about 1 wt %.

3. The carbon nanotube dispersion liquid of claim 1, wherein the solvent includes at least one selected from a group consisting of DI water, DMF, DCE, alcohol based material, toluene based material and alkyne based material.

4. The carbon nanotube dispersion liquid of claim 1, wherein the content of self assembly material in the carbon nanotube dispersion liquid is within about 0.1 vol %~about 1 vol %.

5. A method of manufacturing a carbon nanotube thin film, comprising:
   providing a substrate; and
   coating a carbon nanotube dispersion liquid including carbon nanotubes, a self assembly material having —$NR_2$ in one terminal thereof and —SH in the other terminal thereof, wherein, R is H or $C_nH_{(2n+1)}$, with n is natural number, and a solvent on the substrate to form a thin film,
   wherein the self assembly material having —SH at the other terminal thereof comprises an aminoalkane thiol group,
   wherein the content of carbon nanotube in the carbon nanotube dispersion liquid is below about 10 wt %, and
   wherein the content of self assembly material in the carbon nanotube dispersion liquid is below 1 vol %.

6. The method of claim 5, wherein the substrate is one selected from a group consisting of Si, $SiN_x$, $SiO_2$ and a dielectric layer.

7. A method of manufacturing a display device, comprising:
   providing a substrate;
   forming a gate electrode on the substrate;
   forming a gate insulating layer on the substrate including the gate electrode; and
   coating a carbon nanotube dispersion liquid including carbon nanotubes, a self assembly material having —$NR_2$ in one terminal thereof and —SH in the other terminal thereof, wherein, R is H or $C_nH_{(2n+1)}$, with n is natural number, and a solvent on the gate insulating layer to form a thin film over the gate electrode,
   wherein the self assembly material having —SH at the other terminal thereof comprises an aminoalkane thiol group, wherein the content of carbon nanotube in the carbon nanotube dispersion liquid is below about 10 wt %, and wherein the content of self assembly material in the carbon nanotube dispersion liquid is below 1 vol %.

8. The method of claim 7, wherein the thin film comprises one of a transparent conductive layer or a semiconductor layer.

\* \* \* \* \*